(12) United States Patent
Davis

(10) Patent No.: US 6,400,204 B1
(45) Date of Patent: Jun. 4, 2002

(54) INPUT STAGE ESD PROTECTION FOR AN INTEGRATED CIRCUIT

(75) Inventor: Paul Cooper Davis, Muhlenberg Township, Berks County, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/625,871

(22) Filed: Jul. 26, 2000

(51) Int. Cl.[7] ................................................ H03K 5/08
(52) U.S. Cl. ...................... 327/314; 327/310; 327/313; 327/315; 327/326; 361/91
(58) Field of Search ................................. 327/309, 310, 327/313, 314, 315, 321, 322, 324, 325, 326, 327; 361/56, 91, 111

(56) References Cited

U.S. PATENT DOCUMENTS

| | | | |
|---|---|---|---|
| 4,763,184 A | | 8/1988 | Krieger et al. ............ 357/23.13 |
| 4,990,802 A | | 2/1991 | Smooha ...................... 307/482 |
| 5,264,723 A | | 11/1993 | Strauss ....................... 257/532 |
| 5,304,839 A | | 4/1994 | Chen et al. .................. 257/546 |
| 5,345,357 A | | 9/1994 | Painka ......................... 361/56 |
| 5,430,602 A | * | 7/1995 | Chin et al. ................... 361/212 |
| 5,446,302 A | | 8/1995 | Beigel et al. |
| 5,463,520 A | | 10/1995 | Nelson ......................... 361/56 |
| 5,521,783 A | * | 5/1996 | Wolfe et al. .................. 361/56 |
| 5,672,896 A | * | 9/1997 | Lee et al. .................... 257/360 |
| 5,774,318 A | * | 6/1998 | McClure et al. .............. 361/56 |
| 5,825,600 A | * | 10/1998 | Watt ............................. 326/56 |
| 5,838,146 A | * | 11/1998 | Singer ........................ 323/270 |
| 5,859,758 A | * | 1/1999 | Kim ........................... 361/111 |
| 6,025,746 A | * | 2/2000 | So ............................. 327/325 |

OTHER PUBLICATIONS

"Input–Protection Scheme Tops Other Approaches," K. Natarajan, Mediatronix Private Limited, Kerala, India, *Design Ideas, EDN*, Jan. 6, 2000.

"ESD In Silicon Integrated Circuits," Ajith Amerasekera et al., *Design And Measurement in Electronic Engineering*, 1995.

* cited by examiner

Primary Examiner—Timothy P. Callahan
Assistant Examiner—An T. Luu

(57) ABSTRACT

An integrated circuit is disclosed in which a steering diode is coupled between an input bond pad and a ground bond pad. The steering diode is reverse biased when a voltage applied to the input bond pad exceeds the voltage at the ground bond pad. A circuit coupled between the input bond pad and the ground bond pad includes a transistor having a first electrode coupled the input bond pad and a second electrode coupled to the ground bond pad. There may be other circuit elements between the emitter and the ground bond pad. At least two series coupled diodes are coupled between the input bond pad and the ground bond pad. The at least two series coupled diodes provide ESD protection to the transistor and circuit coupled between the input bond pad and the ground bond pad.

44 Claims, 2 Drawing Sheets

INPUT STAGE ESD PROTECTION FOR AN INTEGRATED CIRCUIT

TECHNICAL FIELD

The present invention relates generally to integrated circuits, and in particular to electrostatic discharge (ESD) protection of circuitry coupled to an input stage of an integrated circuit.

BACKGROUND OF THE INVENTION

The protection of integrated circuits (ICs) from damage due to ESD has received increased design attention, particularly as circuit geometries migrate to smaller dimensions. The book "ESD in Silicon Integrated Circuits" by A. Amerasekera and C. Duvvury, copyrighted in 1995 by John Wiley & Sons, which is hereby incorporated by reference, discloses many techniques for providing protection from electrostatic discharge phenomena. ESD damage can occur as a result of a voltage ESD event or a current ESD event. An ESD event may cause current of magnitudes in the range of one-half to three amperes. The damage may occur during manufacture of the IC chip, or more commonly, after the chip is packaged such as during handling, shipping or use.

One ESD protection technique to protect the input of a packaged IC employs resistors to reduce ESD currents transmitted through bond pads to circuits on the IC. ESD events are transmitted to chip bond pads of packaged chips by package leads. Another technique employs a transistor to clamp the operating voltage on an input bond pad to a safe level. Yet another technique employs a four-layer device, such as a thyristor, to introduce hysteresis into the protective circuitry.

Yet another technique for protecting the input of an integrated circuit from an ESD event has been to provide two steering diodes, each having an area large enough to conduct the expected current. In this technique as shown in FIG. 10, one steering diode, SD1, is coupled between the input bond pad and the positive voltage supply pad, $V_{cc}P$. Another steering diode SD2, is coupled between ground bond pad 18j and the input bond pad 16j, with its anode coupled to ground and its cathode coupled to the input bond pad. Under normal operating conditions, steering diodes SD1 and SD2 are reversed biased. A clamping device, such as a zener diode ZDj is coupled between the positive voltage supply bond pad $V_{cc}P$ and the ground bond pad 18j. With its cathode coupled to $V_{cc}P$ and its anode coupled to ground, diode ZDj under normal operation of the circuit of FIG. 10 is reversed biased and non-conducting. When the positive supply voltage exceeds a normal operating voltage, diode ZDj goes into avalanche breakdown and conducts. Subsequently, when the voltage at the positive supply voltage pad $V_{cc}P$ decreases to normal operating levels, the zener diode ZDj turns off.

An ESD test is normally conducted on a package in which an integrated circuit chip is encapsulated without a supply voltage applied. With transistor 14j not coupled to the input 5 bond pad, a positive ESD pulse between the input bond pad and ground bond pad forward biases steering diode SD1.

During a negative ESD event when the voltage at the input bond pad of FIG. 10 is more negative than the ground bond pad, the steering diode SD2 becomes forward biased with a low voltage drop such that the transistor 14j, which concurrently is reverse biased, is not damaged.

During a positive ESD event, the reverse bias voltage across diode ZDj of FIG. 10 increases and diode ZDj goes into breakdown mode and conducts. The voltage at the positive voltage supply will rise until clamping device ZDj conducts. The voltage at the input pad will rise to the level of the breakdown voltage of diode ZDj plus the forward voltage drop of the steering diode. When the base of the transistor is connected to the input bond pad, the transistor will become forward biased. If the transistor is large enough, the transistor will carry all of the current caused by the ESD event to the ground bond pad without being damaged.

While such techniques have offered some ESD protection, further improvement is considered necessary. The need for enhanced limited current ESD event protection of circuits coupled to an input bond pad of an integrated circuit operable at radio frequencies of operation increase is desirable.

SUMMARY OF THE INVENTION

In accordance with the present invention, an integrated circuit includes an input bond pad and a ground bond pad. A circuit coupled between the input bond pad and the ground bond pad includes a transistor having a first electrode coupled to the input bond pad and a second electrode coupled to the ground bond pad. A steering diode is coupled between the input bond pad and the ground bond pad. The steering diode is reverse biased, both under normal operating conditions and during an ESD event, when a voltage applied to the input bond pad exceeds the voltage at the ground bond pad.

There may be other circuit elements between the emitter and the ground bond pad. At least two series connected diodes are coupled between the input bond pad and the ground bond pad. The anode of one of the at least two series connected diodes is coupled to the input bond pad. The cathode of one of the at least two series connected diodes is coupled to the ground bond pad. The at least two series connected diodes contribute, along with the steering diode, to ESD protection of the circuit coupled between the input bond pad and the ground bond pad.

DETAILED DESCRIPTION

Figure 1:
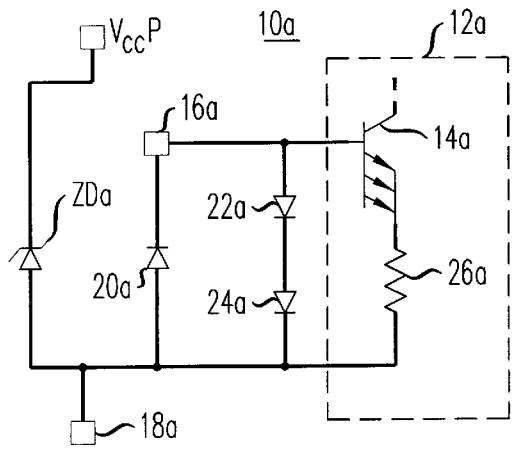
FIG. 1 is a schematic diagram of a portion of an integrated circuit incorporating electrostatic discharge protection of an input stage of a circuit comprising a bipolar transistor in accordance with the present invention.

A schematic diagram of a portion of an integrated circuit 10a having improved ESD protection is illustrated in FIG. 1. The input stage of a circuit 12a to which ESD protection is afforded, such as a cascoded, low noise amplifier operable at radio frequencies, such as frequencies greater than 500 megahertz, is in an integrated circuit package. Low noise amplifiers are typically designed with large transistors coupled to the input bond pad. Circuit 12a includes a NPN transistor in a common-emitter configuration with the base-emitter junction coupled between an input bond pad 16a and an AC ground bond pad 18a, although the invention is not limited thereto. While a single, multi-emitter transistor is illustrated, for noise reduction there may be more than one transistor configured in parallel operation. A steering diode 20a is coupled between ground bond pad 18a and input bond pad 16a to accommodate negative pulse ESD events. At least two series connected diodes 22a and 24a are coupled between the input bond pad 16a and the ground bond pad 18a to accommodate positive pulse ESD events. The integrated circuit 10a may also include a clamping device, such as a zener diode ZDa having a cathode coupled to a power supply bond pad $V_{cc}P$ and an anode coupled to the ground bond pad 18a.

Circuit 12a is a portion of an integrated circuit 10a, which may include, but is not limited to, a cascoded bipolar common-emitter low-noise amplifier. The input stage of circuit 12a has a transistor 14a in a common-emitter configuration with the base emitter junction coupled between input bond pad 16a and ground bond pad 18a. There may be other circuit components, such as transistors, capacitors, diodes, inductors, and/or resistors (not shown) between the emitter of transistor 14a and ground bond pad 18a, or between the base of transistors 14a and the input bond pad 16a. While these components linearize operation of circuit 12a in normal operation, they have negligible effect during an ESD event and therefore are not shown.

Steering diode 20a with its anode coupled to ground bond pad 18a and its cathode coupled to input bond pad 16a is reverse biased under normal operation of circuit 12a. Steering diode 20a protects input bond pad 16a during a negative ESD pulse. When the input bond pad 16a becomes negative relative to ground, the bias on steering diode 20a reverses to be forward biased developing a one diode voltage drop thereacross. Steering diode 20a conducts under these conditions, minimizing the reverse bias voltage developed across the base-emitter junction of transistor 14 due to the negative ESD pulse. Since steering diode 20a reverses bias and becomes conductive under conditions of a negative ESD pulse, the reverse bias voltage developed across the base-emitter junction of transistor 14a is limited to one diode voltage drop thus preventing reverse bias of the base-emitter junction of transistor 14a from becoming larger, eventually exceeding the power dissipation the base-emitter junction can withstand without damage. At even lower current ESD events, the current gain, beta, may be degraded due to large reverse bias voltages.

Transistor 14a includes an inherent base resistance. Base resistance is inversely proportional to the size of the transistor. Since for any processing technology, the thickness of a transistor base is about the same, the base resistance of a bipolar transistor is proportional to the area of the transistor. The base resistance of a large area transistor is small and thus negligible during an ESD event. However, the base resistance of a smaller area transistor is greater and thus not negligible during an ESD event. The base resistance contributes to limiting the current passing through the transistor during an ESD event.

If transistor 14a is sized, that is of sufficient volume, for the processing/line-width technology in which it is fabricated to carry all of the expected current due to an ESD event without damage, a steering diode between input bond pad 16 and the positive voltage supply $V_{cc}P$ is not necessary as such a steering diode would not become forward biased during the positive negative ESD event. For example, a 70×10E-6 meter by 70×10E-6 meter by 0.15×10E-6 meter transistor 14a in the absence of diodes 22a and 24a is able to withstand the current surge from an ESD event without damage. A transistor of this size is not necessarily the smallest transistor that could withstand an ESD event without damage absent diodes 22a and 24a.

With diodes 22a and 24a present, transistor 14a can be made smaller, to substantially any dimensions that will permit the transistor to function, and still withstand an ESD event without damage. Base resistance of a bipolar transistor is inversely proportional to the size of the transistor. As the size of transistor 14a is made smaller, the base resistance of the transistor increases, limiting ESD event current flow through the transistor which in turn contributes to protecting transistor 14a from damage due to the ESD event. With diodes 22a and 24a present in integrated circuit 10a, circuit 12a can withstand very high voltage transients on input bond pad 16a, such as voltages exceeding 2000 volts.

Figure 10:
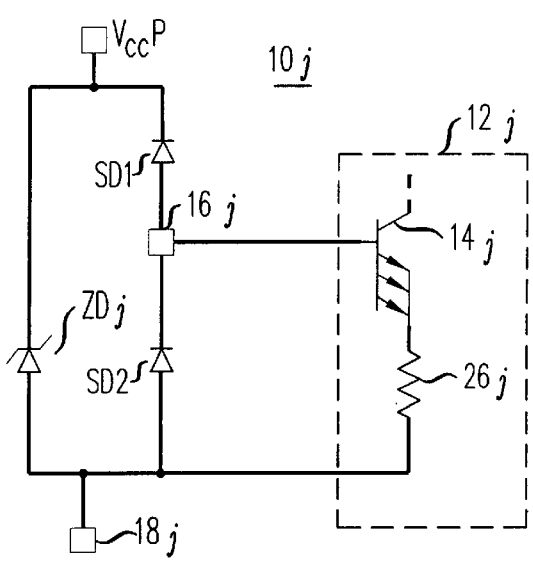
FIG. 10 is a schematic diagram of a portion of an integrated circuit illustrating prior art input stage electrostatic discharge protection.

The capacitance load by such a steering diode on input bond pad 16a may be reduced by elimination of the steering diode (diode SD1 in FIG. 10). The presence of a steering diode between input bond pad 16a and $V_{cc}P$ degrades the radio frequency signal applied to input bond pad 16a because the capacitance of the diode at high frequencies results in a low-impedance between the input bond pad and pad $V_{cc}P$. The high frequency low impedance diverts some of the power of an input signal applied to input bond pad 16a to the power supply coupled to positive voltage pad $V_{cc}P$ rather than providing all of the power of the input signal to the base of transistor 14a.

With two diodes 22a and 24a coupled between input bond pad 16a and ground bond pad 18a, transistor 14a can be made smaller. The voltage drop across diodes 22a and 24a is limited to two diode voltage drops and is the same voltage developed across the base-to-emitter junction of transistor 14a and any impedance, such as resistor 26a, present between the emitter of transistor 14 and ground bond pad 18a. The limited voltage drop appears across transistor 14a, base-to-emitter junction, resistor 26a and the inherent base resistance. Since one of the diode voltage drops is accounted for across the base-to-emitter junction of transistor 14a, the other diode voltage drop appears across the base resistance and resistor 26a. The impedance of resistors 26a and the inherent base resistance limit the current so as not to damage transistor 14a during an ESD event. Since the base resistance inherent in transistor 14a contributes to limiting the current through transistor 14a during an ESD event, transistor 14a can be made smaller when diodes 22a and 24a are present as compared to when diodes 22a and 24a are not present.

For the processing line-width technology in which it is fabricated, if transistor 14a is not sized to carry all of the expected current due to an ESD event without damage, an alternate path to ground is necessary to provide ESD protection to transistor 14a during an ESD event. One such alternate path to ground is at least one steering diode between the input bond pad 16a and ground bond pad 18a However, with only one steering diode present, that diode would be forward biased and turn on during normal operation of circuit 12a. Thus, at least two diodes are coupled between the input bond pad 16a and ground bond pad 18a. The anode of diode 22a is coupled to input bond pad 16a. The cathode of diode 22a is coupled to the anode of diode 24a. The cathode of diode 24a is coupled to ground bond pad 18a. Diodes 22a and 24a are slightly forward biased under normal operating conditions of circuit 12a. Diodes 22a and 24a protect input bond pad 16a from a positive ESD pulse. Under normal operating conditions of circuit 12a, the dc voltage developed across resistor 26a is less than one diode voltage drop, thus less than about 0.7 volts. Diodes 22a and 24a, although forward biased during normal operation of circuit 12a, are insufficiently forward biased to conduct.

When the input bond pad 16a becomes positive relative to ground bond pad 18adue to a positive ESD event, the bias on series coupled diodes 22a and 24a increases until diodes 22a and 24a begin to conduct. Diodes 22a and 24a conducting limits the voltage rise on input bond pad 16a relative to ground bond pad 18a. With the diodes 22a and 24a present, transistor 14a can be made smaller than if diodes 22 and 24 were not present. In addition, diode 20a can be manufactured to maximize performance of circuit 12, such as being as small as possible to minimize capacitance.

Each of diodes 20a, 22a and 24a are sized to handle currents in the range of one to two amperes of current. Since diodes 22a and 24a are coupled in series, the total capacitance on input bond pad 16a due to the presence of diodes 22a and 24a is less than the capacitance of either diode alone since the total inverse capacitance is the sum of the inverse of each of the individual capacitances. When the diodes are identical, the capacitance is reduced to one-half of the capacitance of a single diode. Reducing the capacitance on input bond pad 16a reduces loss of the signal provided to circuit 12a.

Figure 2:
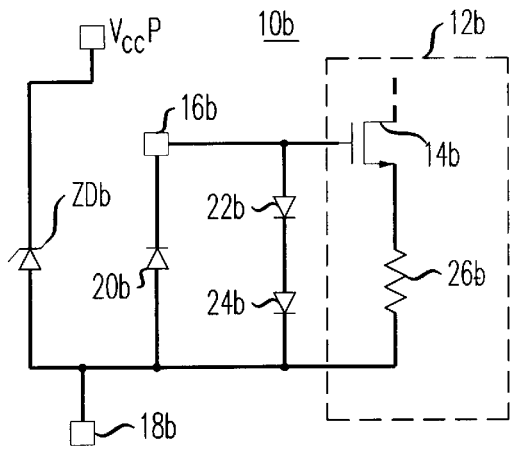
FIG. 2 is a schematic diagram of a portion of an integrated circuit incorporating electrostatic discharge protection of an input stage of a circuit comprising a metal oxide semiconductor transistor.

The transistor being protected is not limited to being a bipolar transistor. The transistor may, for example, be a metal oxide semiconductor (MOS) transistor. FIG. 2 illustrates an alternate embodiment of the invention in which transistor 14a of FIG. 1 is replaced by a MOS transistor 14b. In circuit 12b of integrated circuit 10b, the gate of transistor 14b is coupled to input bond pad 16b, the source is coupled to ground bond pad 18b. The breakdown of the gate-to-source capacitance of transistor 14b must be designed to be greater than two diode voltage drops. The turn-on voltage for transistor 14b must be designed to be less than two voltage drops.

In an ESD event, the voltage on input bond pad 16b does not exceed two diode voltage drops due to the presence of diodes 22b and 24b, thereby protecting MOS transistor 14b. Two diode voltage drops is not sufficient to damage the gate-to-source capacitance of transistor 14b.

Figure 3:
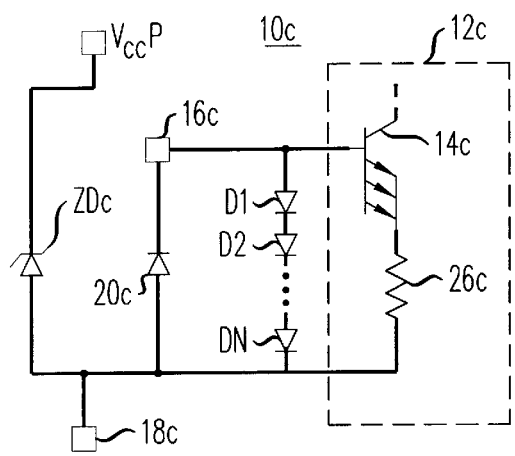
FIG. 3 is a schematic diagram of a portion of an integrated circuit incorporating an alternate embodiment electrostatic discharge protection circuit.

FIG. 3 illustrates an alternative embodiment of the invention in which circuit 12c of integrated circuit 10c includes more than two diodes connected in series between input bond pad 16c and ground bond pad 18c. More than two diodes further reduces the capacitance load on input bond pad 16c. Furthermore, since the voltage developed across resistor 26c is less than (N−1), diode voltage drops, where N is the number of diodes under normal operating conditions of circuit 12c, the diodes D1, D2, . . . , DN, although forward biased, are not sufficiently forward biased to be conductive. Under conditions of an ESD event where input bond pad 16c is at a higher potential than ground bond pad 18c, the diodes D1, D2, . . . , DN, would be sufficiently forward biased to be conductive, thereby providing a path to ground for current produced by an ESD event and in turn protecting transistor 14c and circuit 12c from damage. One skilled in the art could design a metal oxide semiconductor circuit 12c using multiple diodes D1, D2, . . . , DN, where the turn-on voltage is greater than two diode voltage drops.

A diode manufactured as small as possible in a given processing/line width technology has a smaller cathode-to-anode capacitance than a larger diode manufactured in the same processing/line width technology. A smaller capacitance provides less capacitance on the input bond pad and thereby less of a capacitive load to be charged by an input signal applied to the input bond pad 16c. However, a small diode has a large impedance and therefore provides less protection during an ESD event. Thus, a trade-off is made between the ESD protection provided and the magnitude of parasitic capacitance.

Figure 4:
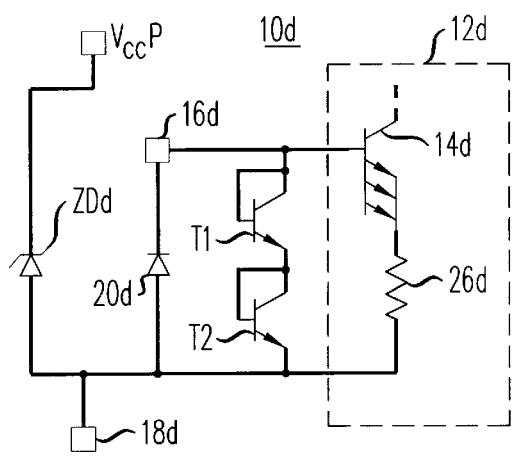
FIG. 4 is a schematic diagram of a portion of an integrated circuit, similar to FIG. 1, in which bipolar transistors have been configured as diodes.
Figure 5:
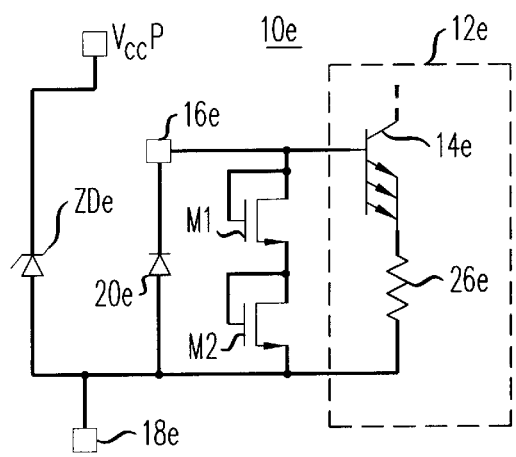
FIG. 5 is a schematic diagram of a portion of an integrated circuit, similar to FIG. 4, in which the transistors configured as diodes are metal oxide semiconductor transistors.

FIG. 4 illustrates an alternate embodiment integrated circuit 10d. In the embodiment illustrated in FIG. 4, the at least two diodes coupled between input bond pad 16d and output bond pad 18d are transistors configured as diodes TD1 and TD2. The transistors configured as diodes in FIG. 4 are illustrated as bipolar transistors but may be fabricated in any technology including but not limited to metal oxide semiconductor technology, as illustrated in FIG. 5.

Figure 6:
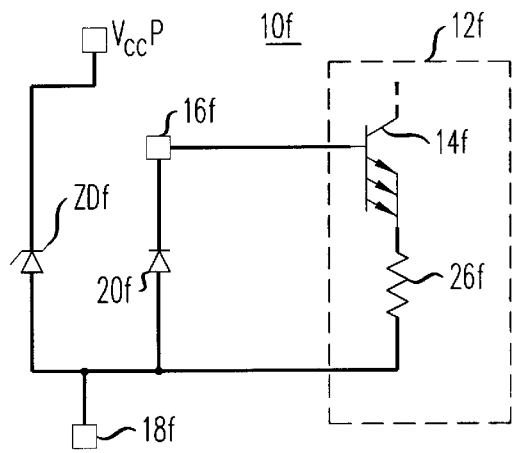
FIG. 6 is a schematic diagram of a portion of an integrated circuit incorporating electrostatic discharge protection of an input stage of a circuit utilizing a single steering diode.

FIG. 6 illustrates an alternate embodiment integrated circuit 10f in which transistor 14f is physically large enough, that is of sufficient volume, to not sustain damage during an ESD event of a forward base-to-emitter current pulse. The schematic diagram of FIG. 6 is a portion of an integrated circuit incorporating electrostatic discharge protection of an input stage of a circuit utilizing a single steering diode. The embodiment illustrated in FIG. 6 is similar to the circuit illustrated in FIG. 10. The steering diode between input bond pad 16f and ground bond pad 18f is retained, while the steering diode SD1 of FIG. 10 coupled between the input bond pad 16j and input power bond pad $V_{cc}P$ is removed. Removing the steering diode between the input bond pad 16j and power supply bond pad $V_{cc}P$ reduces the capacitive load on the input bond pad 16f while retaining substantially all of the ESD protection afforded by steering diode 20f. Transistor 14f must be large enough to carry any expected ESD current without damage.

Figure 7:
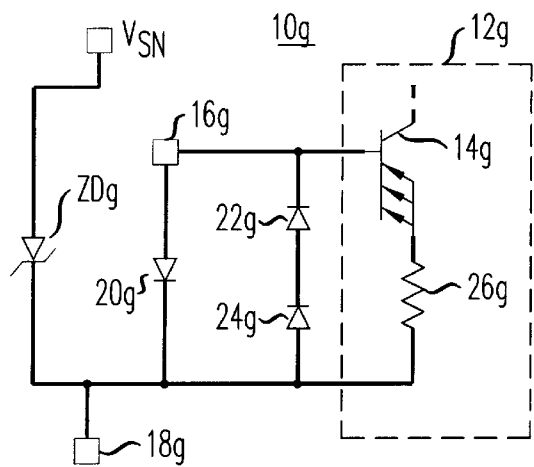
FIG. 7 is a schematic diagram of a portion of an integrated circuit incorporating electrostatic discharge protection of an input stage of a circuit comprising a PNP transistor in a common emitter configuration.

FIG. 7 illustrates an alternate embodiment integrated circuit 10g incorporating electrostatic discharge protection of an input stage of a circuit 12g comprising a PNP transistor 14g in a common emitter configuration. One skilled in the art would recognize the need to reverse polarity of the power supply, as well as steering diode 20g and diodes 22g and 24g.

Figure 8:
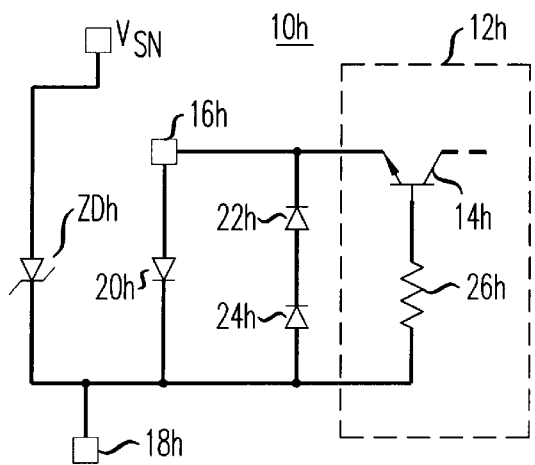
FIG. 8 is a schematic diagram of a portion of an integrated circuit incorporating electrostatic discharge protection of an input stage of a circuit comprising an NPN transistor in a common base configuration.

FIG. 8 illustrates an alternate embodiment integrated circuit 10h incorporating electrostatic discharge protection of an input stage of a circuit 12h comprising an NPN transistor 14h in a common base configuration.

Figure 9:
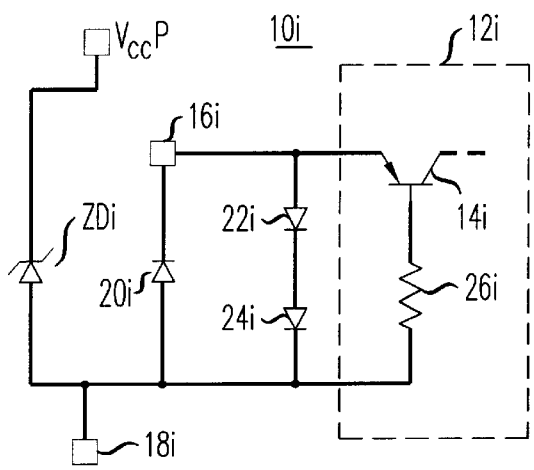
FIG. 9 is a schematic diagram of a portion of an integrated circuit incorporating electrostatic discharge protection of an input stage of a circuit comprising a PNP transistor in a common base configuration.

FIG. 9 illustrates an alternate embodiment integrated circuit 10i incorporating electrostatic discharge protection of an input stage of a circuit 12i comprising a PNP transistor 14j in a common base configuration.

As is known in the art, the integrated circuits 10a through 10j are typically enclosed in a package. The integrated circuit is positioned on the paddle of a lead frame having a paddle and isolated leads. Wires are bonded between corresponding bond pads on the integrated circuit and leads of the lead frame. The integrated circuit chip and bond wires are enclosed in the package, such as in an overmold operation to form packaged integrated circuits.

While reference has been made to an input bond pad and a ground bond pad, coupling to the electrical equivalent of these bond pads would suffice. Transistors illustrated in the various embodiments are shown as particular types of transistors, although the invention is not limited thereto. Other types of transistors may be used with the invention. Various circuits have been illustrated but not all possible combinations of the various circuits have been illustrated.

Combinations of circuits illustrated are considered within the scope of the invention. While the above embodiments give typical design values suitable for an illustrative embodiment implemented in 0.25 micron technology, a wide range of transistors, resistors, and diode sizes are possible depending upon the protection needs required and component values.

What is claimed is:

1. An integrated circuit, comprising:
   a steering diode coupled between an input bond pad and a ground bond pad, the steering diode oriented to be reversed biased when a voltage applied to the input bond pad exceeds the voltage at the ground bond pad;
   a circuit to be protected from an electrostatic discharge event coupled between the input bond pad and the ground bond pad, the circuit comprising a transistor having a first electrode directly coupled to the input bond pad, and a second electrode coupled to the ground bond pad; and
   at least two series connected diodes coupled between the input bond pad and the ground bond pad, the at least two series connected diodes being forward biased and non-conducting during normal operation of the circuit, the diodes conducting during the electrostatic discharge event.

2. An integrated circuit as recited in claim 1, wherein the steering diode is reverse biased when a voltage applied to the input bond pad is more positive than the voltage at the ground bond pad.

3. An integrated circuit as recited in claim 1, wherein the steering diode is reverse biased when a voltage applied to the input bond pad is more negative than the voltage at the at the ground bond pad.

4. An integrated circuit, as recited in claim 1, wherein the anode of a first one of the at least two series connected diodes is coupled to the input bond pad, the cathode of a second one of the at least two series connected diodes is coupled to the ground bond pad, the at least two series connected diodes being forward biased and non-conducting during normal operation of the circuit.

5. An integrated circuit as recited in claim 1, wherein the transistor comprises a bipolar transistor.

6. An integrated circuit as recited in claim 5, wherein the transistor is in a common emitter configuration.

7. An integrated circuit as recited in claim 5, wherein the transistor is configured in a common base configuration.

8. An integrated circuit as recited in claim 5, wherein the transistor is an NPN transistor.

9. An integrated circuit as recited in claim 5, wherein the transistor is a PNP transistor.

10. An integrated circuit as recited in claim 1, wherein the transistor comprises a metal oxide semiconductor transistor.

11. An integrated circuit as recited in claim 10, wherein the transistor is configured in a common source configuration.

12. An integrated circuit as recited in claim 1, wherein the at least two diodes comprises two diodes.

13. An integrated circuit as recited in claim 1, wherein the at least two series connected diodes comprises more than two diodes.

14. An integrated circuit as recited in claim 1, further comprising a degeneration device between the second electrode and the ground bond pad.

15. An integrated circuit as recited in claim 1, wherein at least one of the at least two series connected diodes is a transistor configured as a diode.

16. An integrated circuit as recited in claim 15, wherein the at least one of the at least two series connected diodes is a bipolar transistor.

17. An integrated circuit as recited in claim 15, wherein the at least one of the at least two series connected diodes is a metal oxide semiconductor transistor.

18. An integrated circuit as recited in claim 1, further comprising a zener diode coupled between a power supply bond pad and the ground bond pad, the zener diode having a cathode coupled to the power supply bond pad and an anode coupled to the ground bond pad.

19. An integrated circuit as recited in claim 1, further comprising a zener diode coupled between a power supply bond pad and the ground bond pad, the zener diode having an anode coupled to the power supply bond pad and a cathode coupled to the ground bond pad.

20. An integrated circuit as recited in claim 1, wherein the integrated circuit is encapsulated in a housing with leads coupled to said bond pads extending therefrom.

21. An integrated circuit as recited in claim 1, wherein the cathode of a first one of the at least two series coupled diodes is coupled to the anode of the second one of the at least two series coupled diodes.

22. An integrated circuit as recited in claim 21, wherein the anode of a second one of the at least two series coupled diodes is coupled to the cathode of the first one of the at least two series coupled diodes.

23. An integrated circuit, comprising:
   a steering diode coupled between an input bond pad and a ground bond pad, the steering diode oriented to be reversed biased when a voltage applied to the input bond pad exceeds the voltage at the ground bond pad, the integrated circuit being configured so as to eliminate a need for a second steering diode between the input bond pad and a positive voltage pad; and
   a circuit to be protected from an electrostatic discharge event coupled between the input bond pad and the ground bond pad, the circuit comprising a transistor having a first electrode directly coupled to the input bond pad, and a second electrode coupled to the ground bond pad.

24. An integrated circuit as recited in claim 23, wherein the steering diode is reverse biased when a voltage applied to the input bond pad is more positive than the voltage at the ground bond pad.

25. An integrated circuit as recited in claim 23, wherein the steering diode is reverse biased when a voltage applied to the input bond pad is more negative than the voltage at the ground bond pad.

26. An integrated circuit as recited in claim 23, wherein the anode of a first one of the at least two series connected diodes is coupled to the input bond pad, the cathode of a second one of the at least two series connected diodes is coupled to the ground bond pad, the at least two series connected diodes being forward biased and non-conducting during normal operation of the circuit.

27. An integrated circuit as recited in claim 23, wherein the transistor comprises a bipolar transistor.

28. An integrated circuit as recited in claim 27, wherein the transistor is in a common emitter configuration.

29. An integrated circuit as recited in claim 27, wherein the transistor is configured in a common base configuration.

30. An integrated circuit as recited in claim 27, wherein the transistor is an NPN transistor.

31. An integrated circuit as recited in claim 27, wherein the transistor is a PNP transistor.

32. An integrated circuit as recited in claim 23, wherein the transistor comprises a metal oxide semiconductor transistor.

33. An integrated circuit as recited in claim 32, wherein the transistor is configured in a common source configuration.

34. An integrated circuit as recited in claim 23, wherein the at least two diodes comprises two diodes.

35. An integrated circuit as recited in claim 23, wherein the at least two diodes comprises more than two diodes.

36. An integrated circuit as recited in claim 23, further comprising a degeneration device between the second electrode and the ground bond pad.

37. An integrated circuit as recited in claim 23, wherein at least one of the at least diodes is a transistor configured as a diode.

38. An integrated circuit as recited in claim 37, wherein the at least one of the at least two diodes is a bipolar transistor.

39. An integrated circuit as recited in claim 37, wherein the at least one of the at least two diodes is a metal oxide semiconductor transistor.

40. An integrated circuit as recited in claim 23, further comprising a zener diode coupled between a power supply bond pad and the ground bond pad, the zener diode having a cathode coupled to the power supply bond pad and an anode coupled to the ground bond pad.

41. An integrated circuit as recited in claim 23, further comprising a zener diode coupled between a power supply bond pad and the ground bond pad, the zener diode having an anode coupled to the power supply bond pad and a cathode coupled to the ground bond pad.

42. An integrated circuit as recited in claim 23, wherein the integrated circuit is encapsulated in a housing with leads coupled to said bond pads extending therefrom.

43. An integrated circuit as recited in claim 23, wherein the cathode of a first one of the at least two series coupled diodes is coupled to the anode of the second one of the at least two series coupled diodes.

44. An integrated circuit as recited in claim 43, wherein the anode of a second one of the at least two series coupled diodes is coupled to the cathode of the first one of the at least two series coupled diodes.

* * * * *